(12) United States Patent
Jeon et al.

(10) Patent No.: US 8,461,011 B2
(45) Date of Patent: Jun. 11, 2013

(54) METHOD FOR FABRICATING A BACK CONTACT SOLAR CELL

(75) Inventors: Min Sung Jeon, Jeonju-si (KR); Won Jae Lee, Seongnam-si (KR); Eun Chel Cho, Yongin-si (KR); Joon Sung Lee, Gunpo-si (KR)

(73) Assignee: Hyundai Heavy Industries Co., Ltd. (KR)

( * ) Notice: Subject to any disclaimer, the term of this patent is extended or adjusted under 35 U.S.C. 154(b) by 0 days.

(21) Appl. No.: 13/519,249

(22) PCT Filed: Jan. 18, 2011

(86) PCT No.: PCT/KR2011/000354
§ 371 (c)(1),
(2), (4) Date: Jun. 26, 2012

(87) PCT Pub. No.: WO2011/087341
PCT Pub. Date: Jul. 21, 2011

(65) Prior Publication Data
US 2012/0282732 A1    Nov. 8, 2012

(30) Foreign Application Priority Data
Jan. 18, 2010    (KR) .................. 10-2010-0004272

(51) Int. Cl.
*H01L 21/20*    (2006.01)
(52) U.S. Cl.
USPC ............. 438/392; 438/11; 438/618; 438/662; 257/48; 257/700; 257/751; 257/E23.145

(58) Field of Classification Search
USPC ............ 257/48, 700, 751, 758, 774, E23.145; 438/11, 618, 622, 626–629, 637, 672
See application file for complete search history.

(56) References Cited

U.S. PATENT DOCUMENTS
7,339,110 B1    3/2008    Mulligan et al.

FOREIGN PATENT DOCUMENTS
| KR | 10-2002-0049718 | 6/2002 |
| KR | 10-0757797 | 9/2007 |
| KR | 10-0766254 | 10/2007 |

OTHER PUBLICATIONS
International Search Report—PCT/KR2011/000354 dated Sep. 27, 2011.
Written Opinion—PCT/KR2011/000354 dated Sep. 27, 2011.

*Primary Examiner* — Evan Pert
*Assistant Examiner* — Mark A Laurenzi
(74) *Attorney, Agent, or Firm* — Cantor Colburn LLP (57) ABSTRACT

The present disclosure relates to a method for manufacturing a back electrode-type solar cell. The method for manufacturing a back electrode-type solar cell disclosed herein includes: A method for manufacturing a back electrode-type solar cell, comprising: preparing an n-type crystalline silicon substrate; forming a thermal diffusion control film on a front surface, a back surface and a side surface of the substrate; forming a p-type impurity region by implanting p-type impurity ions onto the back surface of the substrate; patterning the thermal diffusion control film so that the back surface of the substrate is selectively exposed; and forming a high-concentration back field layer (n+) at an exposed region of the back surface of the substrate and a low-concentration front field layer (n−) at the front surface of the substrate by performing a thermal diffusion process, and forming a p+ emitter region by activating the p-type impurity region.

19 Claims, 11 Drawing Sheets

METHOD FOR FABRICATING A BACK CONTACT SOLAR CELL

TECHNICAL FIELD

The present disclosure relates to a method for manufacturing a back electrode-type solar cell, and more particularly, to a method for manufacturing a back electrode-type solar cell, which may minimize the number of processes by grafting a doping process using ion implantation and a thermal diffusion process when forming a p+ region and an n+ region at the back surface of a substrate.

BACKGROUND ART

A solar cell is a core element of solar-light power generation, which directly transforms solar light into electricity, and it may be basically considered as a diode having a p-n junction. Solar light is transformed into electricity by a solar cell as follows. If solar light is incident to a p-n junction of a solar cell, an electron-hole pair is generated, and due to the electric field, electrons move to an n layer and holes move to a p layer, thereby generating photoelectromotive force between the p-n junctions. In this way, if a load or system is connected to both terminals of the solar cell, an electric power may flow to generate power.

A general solar cell is configured to have a front surface and a back electrode respectively at front and back surfaces of the solar cell. Since the front electrode is provided to the front surface which is a light-receiving surface, the light-receiving area decreases as much as the area of the front electrode. In order to solve the decrease of the light-receiving area, a back electrode-type solar cell has been proposed. The back electrode-type solar cell maximizes the light-receiving area of the front surface of the solar cell by providing a (+) electrode and a (−) electrode on a back surface of the solar cell.

Figure 1:
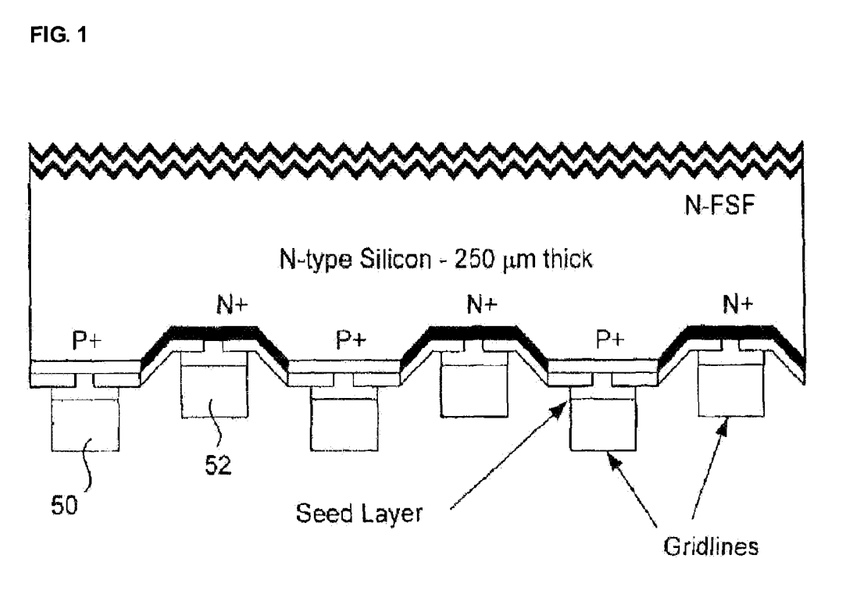
FIG. 1 is a diagram showing a conventional back electrode-type solar cell.

FIG. 1 is a cross-sectional view showing a back electrode-type solar cell proposed in U.S. Pat. No. 7,339,110. Referring to FIG. 1, a p+ region where p-type impurity ions are implanted and a n+ region where n-type impurity ions are implanted by thermal diffusion are provided at the back surface of a silicon substrate, and interdigitated metal electrodes 50, 52 are provided on the p+ region and the n+ region.

In a method for manufacturing a back electrode-type solar cell disclosed in U.S. Pat. No. 7,339,110, thermal diffusion processes are respectively performed to form a p+ region and an n+ region, and an oxide film generated by each thermal diffusion process should be removed. When the thermal diffusion process is performed to form the n+ region, in order to define the n+ region, a process of selectively patterning an oxide film generated when the p+ region is formed is added.

As described above, in the conventional method for manufacturing a back electrode-type solar cell, two thermal diffusion processes must be performed, and at least four photolithography processes and etching processes are required for patterning oxide films and etching masks, resulting in very complicated processes.

DISCLOSURE

Technical Problem

The present disclosure is designed to solve the above problem and the present disclosure is directed to providing a method for manufacturing a back electrode-type solar cell, which may minimize the number of processes by grafting a doping process using ion implantation and a thermal diffusion process when forming a p+ region and an n+ region at the back surface of a substrate.

Technical Solution

In one general aspect, the present disclosure provides a method for manufacturing a back electrode-type solar cell, which includes: preparing an n-type crystalline silicon substrate; forming a thermal diffusion control film on a front surface, a back surface and a side surface of the substrate; forming a p-type impurity region by implanting p-type impurity ions onto the back surface of the substrate; patterning the thermal diffusion control film so that the back surface of the substrate is selectively exposed; and forming a high-concentration back field layer (n+) at an exposed region of the back surface of the substrate and a low-concentration front field layer (n−) at the front surface of the substrate by performing a thermal diffusion process, and activating the p-type impurity region to form a p+ emitter region.

In the patterning of the thermal diffusion control film so that the back surface of the substrate is selectively exposed, the thermal diffusion control film and a predetermined depth of the substrate may be removed at a region where the high-concentration back field layer (n+) is to be formed. In addition, when the thermal diffusion control film and the predetermined depth of the substrate are removed at a region where the high-concentration back field layer (n+) is to be formed, laser may be irradiated onto the thermal diffusion control film at a region where the high-concentration back field layer (n+) is to be formed so that the thermal diffusion control film and the predetermined depth of the substrate are removed, an etching paste may be applied onto the thermal diffusion control film at a region where the high-concentration back field layer (n+) is to be formed so that the thermal diffusion control film and the predetermined depth of the substrate are removed, or the thermal diffusion control film and the predetermined depth of the substrate may be removed by means of reactive ion etching at a region where the high-concentration back field layer (n+) is to be formed. The thickness of the removed substrate may correspond to a depth of the p-type impurity region.

In another general aspect, the present disclosure provides a method for manufacturing a back electrode-type solar cell, which includes: preparing an n-type crystalline silicon substrate; forming a thermal diffusion control film on a front surface, a back surface and a side surface of the substrate; forming a p-type impurity region by implanting p-type impurity ions onto the back surface of the substrate; forming an anti-diffusion film on the back surface of the substrate; patterning the thermal diffusion control film and the anti-diffusion film so that the back surface of the substrate is selectively exposed; and forming a high-concentration back field layer (n+) at an exposed region of the back surface of the substrate and a low-concentration front field layer (n−) at the front surface of the substrate by performing a thermal diffusion process, and activating the p-type impurity region to form a p+ emitter region.

The thickness of the thermal diffusion control film formed at the front surface of the substrate may be relatively smaller than that of the thermal diffusion control films formed at the back surface and the side surface of the substrate. The p+ emitter region may have a sheet resistance of 10 to 60 Ω/sq., the high-concentration back field layer (n+) may have a sheet resistance of 10 to 80 Ω/sq., and the low-concentration front field layer (n−) may have a sheet resistance of 50 to 150 Ω/sq.

Advantageous Effects

The method for manufacturing a back electrode-type solar cell according to the present disclosure gives the following effects.

A back surface field may be easily formed by a single ion implantation process and a single thermal diffusion process, and the patterning work may be minimized.

BEST MODE

Figure 2:
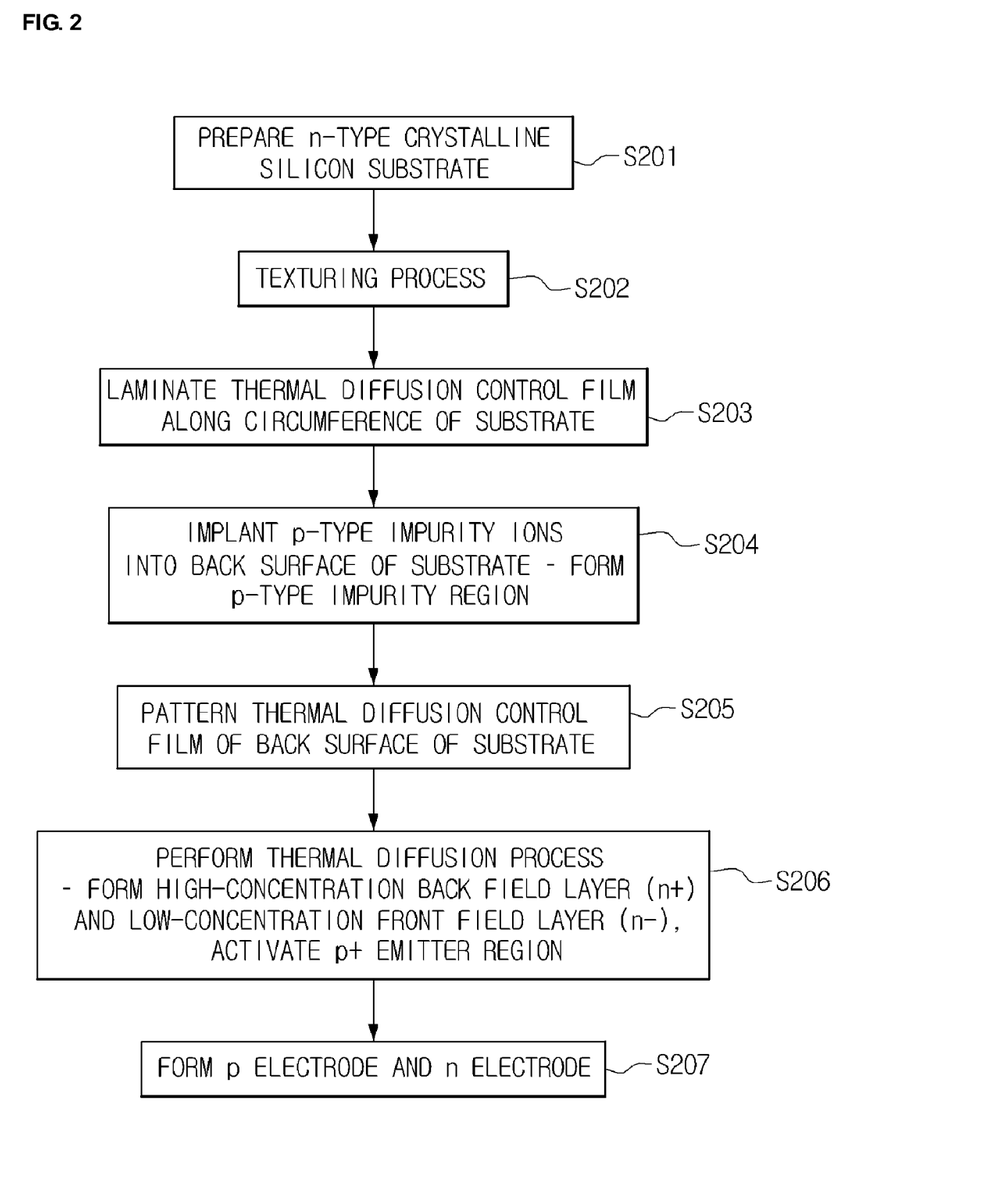
FIG. 2 is a flowchart for illustrating a method for manufacturing a back electrode-type solar cell according to a first embodiment of the present disclosure.

Hereinafter, a method for manufacturing a back electrode-type solar cell according to an embodiment of the present disclosure will be described in detail with reference to the accompanying drawings. FIG. 2 is a flowchart for illustrating a method for manufacturing a back electrode-type solar cell according to a first embodiment of the present disclosure, and FIGS. 3a to 3f are cross-sectional views for illustrating the method for manufacturing a back electrode-type solar cell according to the first embodiment of the present disclosure.

Figure 3A:
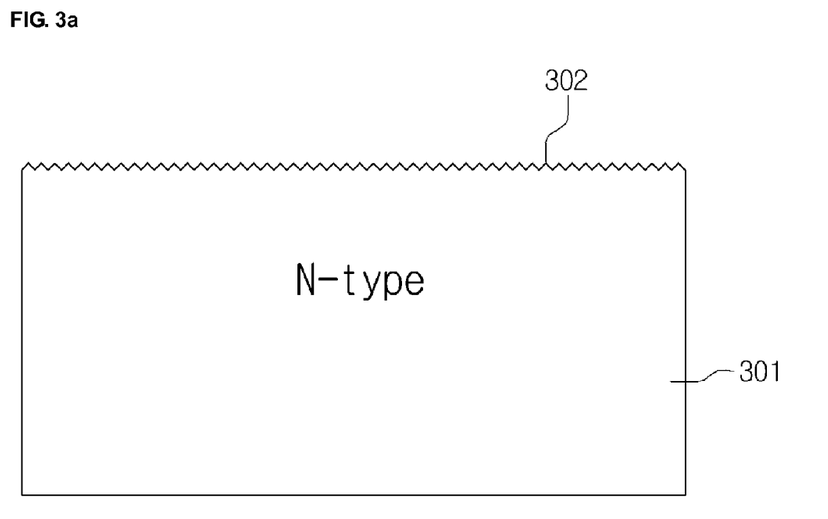
FIGS. 3a to 3f are cross-sectional views for illustrating the method for manufacturing a back electrode-type solar cell according to the first embodiment of the present disclosure.

First, as shown in FIGS. 2 and 3a, a first conductive crystalline silicon substrate 301 is prepared (S201), and a texturing process is performed to form unevenness 302 on the surface of the first conductive silicon substrate 301 (S202). The texturing process is performed to reduce light reflection at the surface of the substrate 301, and may be performed by wet etching or dry etching such as reactive ion etching. The unevenness structure of the surface may be formed at only the light-receiving surface, namely the front surface. The first conductive type may be p-type or n-type, and the second conductive type is opposite to the first conductive type. The following description will be based on that the first conductive type is n-type.

Figure 3B:
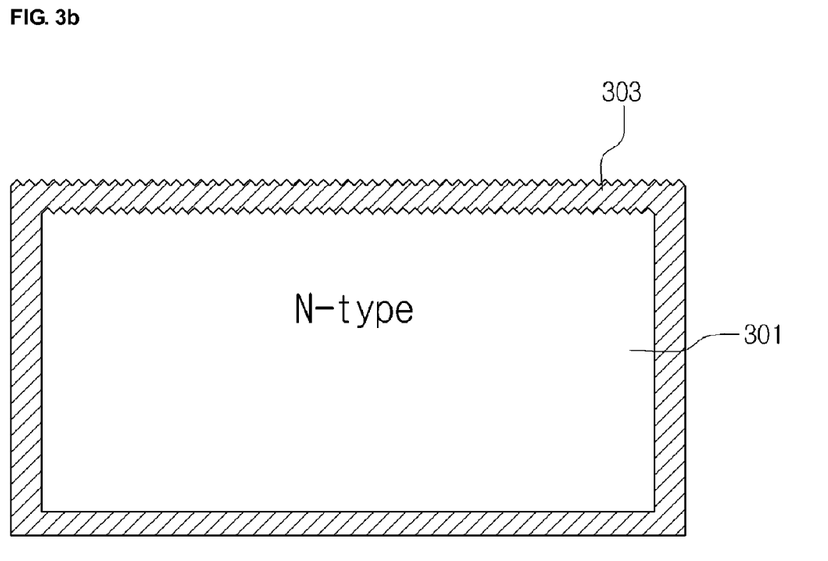

In a state where the texturing process is completed, as shown in FIG. 3b, a thermal diffusion control film 303 having a predetermined thickness is formed along a circumference of the substrate 301 (S203). The thermal diffusion control film 303 plays a role of controlling the degree of thermal diffusion at a certain region when a thermal diffusion process is performed, and the thickness should be set to allow ion implantation. When impurity ions explained later are implanted, the ion implantation includes all kinds of methods where ions are implanted in a particle state. Particularly, any one of ion implantation, ion doping, plasma doping and plasma ion showering may be used.

In addition, when a thermal diffusion process is performed, a thermal diffusion control film 303 on the front surface of the substrate 301 may have a smaller thickness than that of the back surface and the side surfaces of the substrate so that p+ or n+ impurities may be diffused to the front surface of the substrate 301. The thermal diffusion control film 303 may be configured with, for example, a silicon oxide film ($SiO_2$) or a silicon oxide glass (SOG), and may be formed by a general film laminating method such as plasma enhanced chemical vapor deposition (PECVD), thermal oxidation, wet oxidation, spin-on method, spraying and sputtering.

Figure 3C:
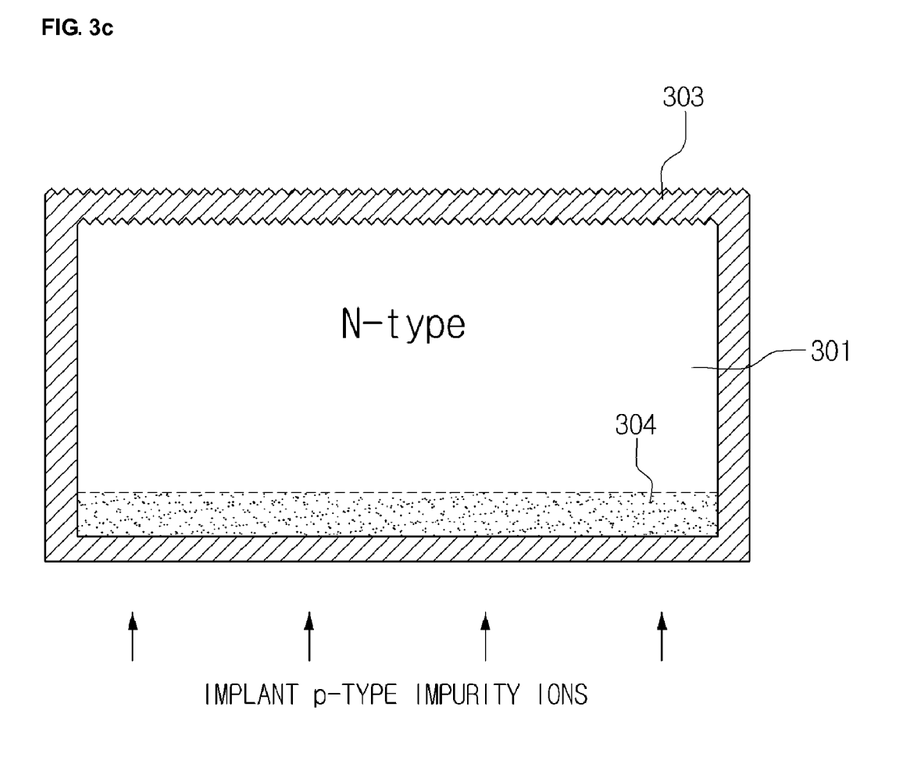

In a state where the thermal diffusion control film 303 is laminated on the front surface, the back surface and the side surface of the substrate 301, as shown in FIG. 3c, second conductive impurity ions, namely p-type impurity ions such as boron (B) or the like, are implanted onto the back surface of the substrate 301 to form a p-type impurity region 304 (S204). The ions should pass through the thermal diffusion control film 303 and be implanted to a certain region of the back surface of the substrate 301, and this may be controlled by means of ion implantation energy, which is about 10 to 50 keV. Along with it, the p-type impurity ions may be implanted by using any one of ion implanting, ion doping and plasma doping.

In addition, the p-type impurity region 304 is activated by a thermal diffusion process described later. When the p-type impurity region 304 is formed, ions with a concentration corresponding thereto should be injected so that the p+ emitter region 307 may have a sheet resistance of 10 to 60 Ω/sq., and the p+ emitter region 307 may have a depth of about 0.3 to 2 μm.

Figure 3D:
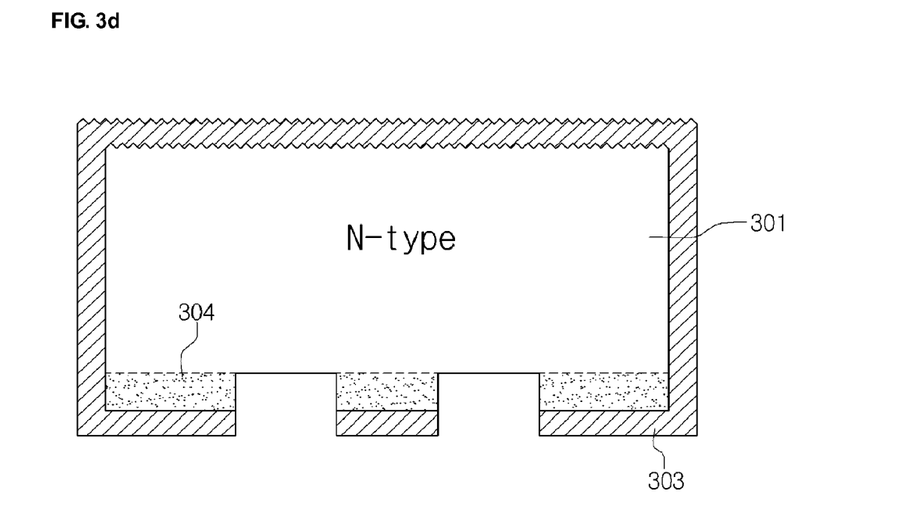

In a state where the p-type impurity region 304 is formed, as shown in FIG. 3d, the thermal diffusion control film 303 and the substrate at the back surface of the substrate 301 are selectively removed at a portion corresponding to a region where the high-concentration back field layer (n+) 305 is formed (S205). The substrate is partially removed along with the thermal diffusion control film in order to remove the p-type impurity region so that the influence of the p-type impurity region to the concentration of the high-concentration back field layer (n+) generated by a thermal diffusion process described later may be minimized.

In order to selectively remove the thermal diffusion control film 303 and a part of the substrate 301, laser ablation may be used. In other words, the thermal diffusion control film 303 and a predetermined thickness of the substrate may be removed by irradiating laser onto the thermal diffusion control film 303 at a region where the high-concentration back field layer (n+) 305 is formed. The thickness of the substrate 301 removed by laser irradiation suitably corresponds to the depth of the p-type impurity region 304.

In addition, an etching paste may be used instead of laser ablation. In detail, the thermal diffusion control film 303 and the predetermined thickness of the substrate 301 may be removed by applying an etching paste onto the thermal diffusion control film 303 by means of ink-jet printing or screen printing at a region where the high-concentration back field layer (n+) is formed. In addition to the above methods, dry etching such as reactive ion etching may be used.

When selectively removing the thermal diffusion control film 303 and a part of the substrate 301, after the thermal diffusion control film 303 is primarily removed, the predetermined thickness of the substrate may be secondarily etched and removed by using an alkali solution or the like, and along with it, the substrate damaged when removing the thermal diffusion control film may be cured.

Figure 3E:
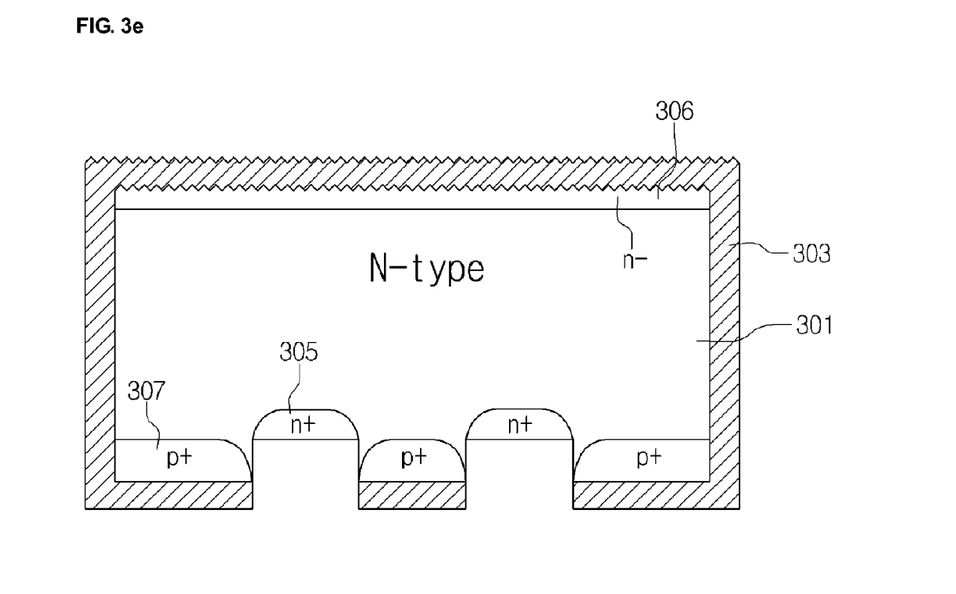

In this state, as shown in FIG. 3e, a thermal diffusion process is performed to form the high-concentration back field layer (n+) 305 and the low-concentration front field layer (n−) 306 simultaneously and the p-type impurity region 304 is activated to form the p+ emitter region 307 (S206). In detail, the silicon substrate 301 is provided in a chamber, and first conductive impurity ions, namely gas (for example, $POCl_3$) containing n-type impurity ions, is supplied into the chamber so that phosphorus (P) ions are diffused into the substrate 301. The exposed region of the back surface of the substrate 301 by removing the thermal diffusion control film 303 exhibits relatively greater diffusion of impurity ions in comparison to a region where the thermal diffusion control film 303 is provided. Accordingly, the high-concentration back field layer (n+) 305 is formed at the exposed region of the back surface of the substrate 301, and the low-concentration front field layer (n−) 306 is formed at the front surface of the substrate 301 where the thermal diffusion control film 303 is provided. Concentrations of the impurity ions in the high-concentration back field layer (n+) 305 and the low-concentration front field layer (n−) 306 may be adjusted so that sheet resistances of the high-concentration back field layer (n+) 305 and the low-concentration front field layer (n−) 306 are respectively 10 to 80 Ω/sq and 50 to 150 Ω/sq. Along with it, the high-concentration back field layer (n+) 305 and the low-concentration front field layer (n−) 306 may have depths of 0.2 to 1.5 µm and 0.1 to 0.4 µm, respectively. In a case where the first conductive impurity ions are p-type, $BBr_3$ gas may be used instead of the $POCl_3$ gas.

In addition to the above method using gas, the thermal diffusion process of the n-type impurity ions may use a method where a film is formed on the surface of the silicon substrate 301 by immersing the silicon substrate 301 in a solution containing n-type impurity ions, for example a phosphorous acid ($H_3PO_4$) solution or a material containing phosphorus (P) or by applying the solution by means of spraying or performing spin-on coating or the like, followed by thermal treatment so that the phosphorus (P) ions are diffused into the substrate 301 to form the high-concentration back field layer (n+) 305 and the low-concentration front field layer (n−) 306.

Figure 3F:
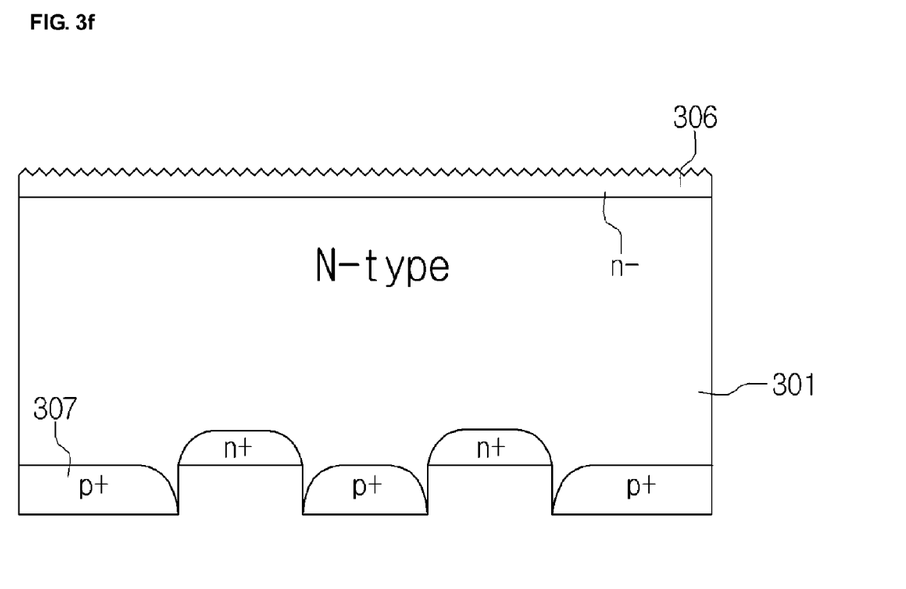

Subsequently, as shown in FIG. 3f, if the thermal diffusion control film 303 and a PSG film which is a byproduct of the thermal diffusion process are removed, the method for manufacturing a back electrode-type solar cell according to an embodiment of the present disclosure is completed.

Next, a method for manufacturing a back electrode-type solar cell according to a second embodiment of the present disclosure will be described. FIGS. 4a to 4g are cross-sectional views for illustrating the method for manufacturing a back electrode-type solar cell according to the second embodiment of the present disclosure.

Figure 4A:
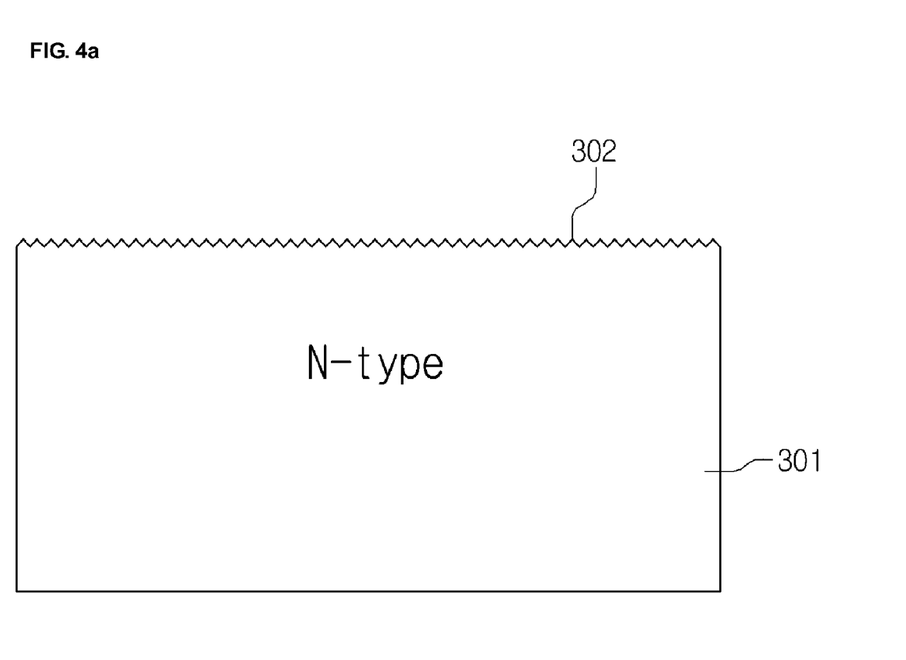
FIGS. 4a to 4g are cross-sectional views for illustrating the method for manufacturing a back electrode-type solar cell according to a second embodiment of the present disclosure.
Figure 4B:
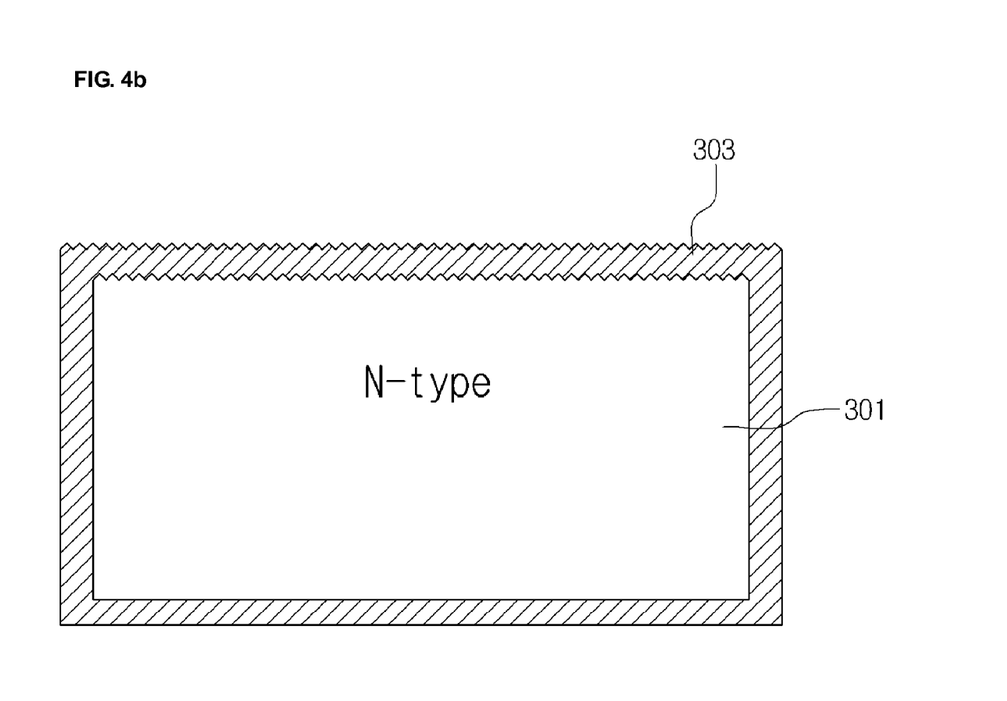
Figure 4C:
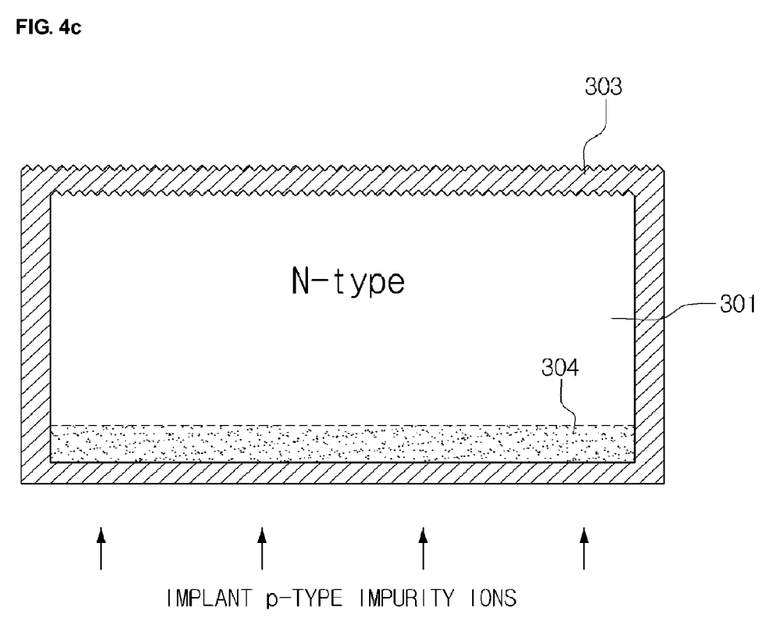
Figure 4D:
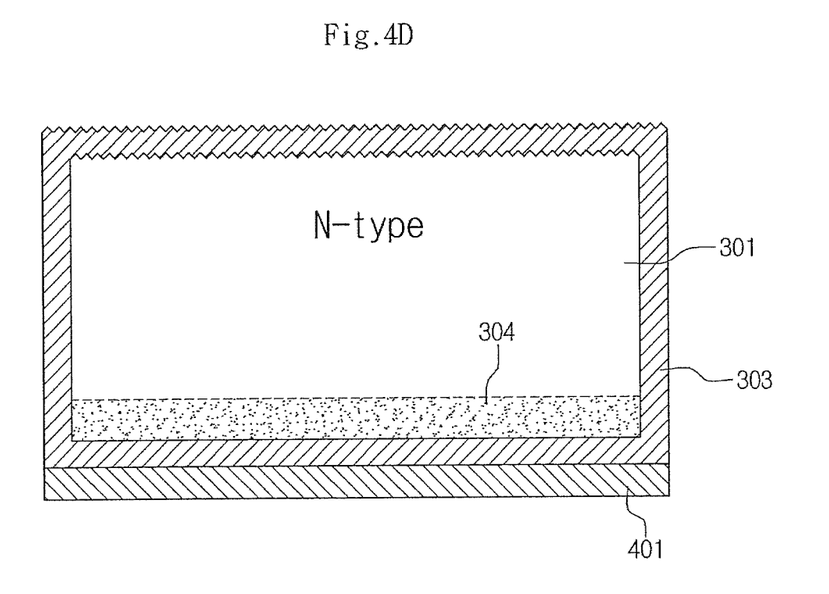
Figure 4E:
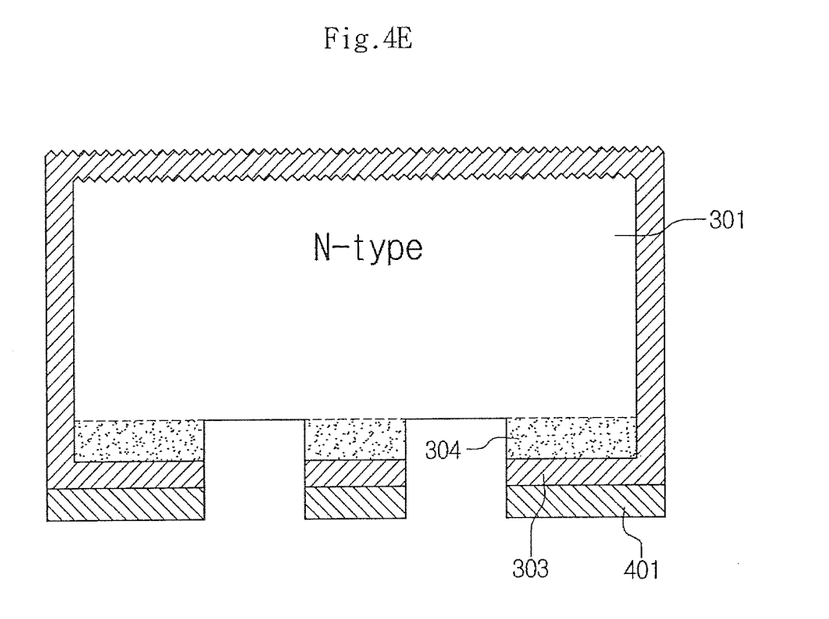
Figure 4F:
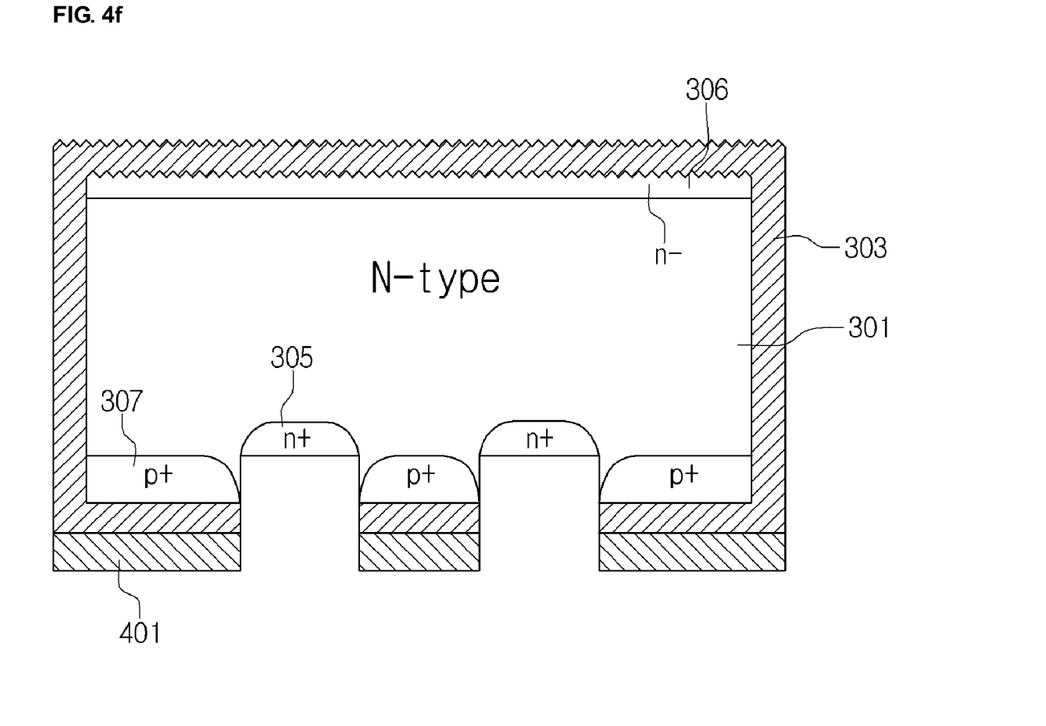
Figure 4G:
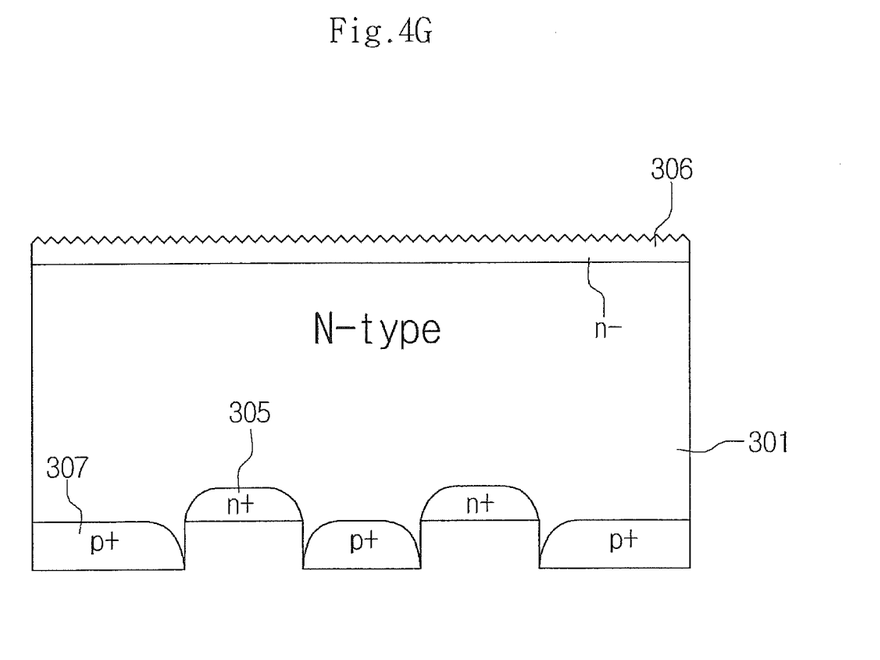

The second embodiment of the present disclosure is characterized in that the diffusion of n-type impurity ions into the p+ emitter region 307 is perfectly prevented when the thermal diffusion process is performed. For this, as shown in FIG. 4d, in a state where the p-type impurity region 304 is formed, an anti-diffusion film 401 is laminated on the thermal diffusion control film 303 at the back surface of the substrate 301, and then, as shown in FIG. 4e, the thermal diffusion control film 303, the anti-diffusion film 401 and a predetermined thickness of the substrate are selectively removed at a portion where the high-concentration back field layer (n+) 305 is to be formed, to expose the back surface of the substrate 301. In this state, as shown in FIG. 4f, a thermal diffusion process is performed to form the high-concentration back field layer (n+) 305 and the low-concentration front field layer (n−) 306, and the p-type impurity region 304 is activated to form the p+ emitter region 307. The anti-diffusion film 401 is representatively a film having an insulating film corresponding to the above, for example a silicon nitride film (SiNx), silicon oxide glass (SOG), an intrinsic amorphous silicon film or the like. Then, as shown in FIG. 4g, the thermal diffusion control film 303 and the anti-diffusion film 401 are removed. Meanwhile, the texturing process, the process of forming the thermal diffusion control film 303, the process of forming the p-type impurity region 304 are identical to those of the first embodiment and not described in detail here.

INDUSTRIAL APPLICABILITY

According to the present disclosure, a back surface field may be easily formed by a single ion implantation process and a single thermal diffusion process, and the patterning work may be minimized.

The invention claimed is:

1. A method for manufacturing a back electrode-type solar cell, comprising:
preparing an n-type crystalline silicon substrate;
forming a thermal diffusion control film on a front surface, a back surface and a side surface of the substrate;
forming a p-type impurity region by implanting p-type impurity ions onto the back surface of the substrate;
patterning the thermal diffusion control film so that the back surface of the substrate is selectively exposed; and
forming a high-concentration back field layer (n+) at an exposed region of the back surface of the substrate and a low-concentration front field layer (n−) at the front surface of the substrate by performing a thermal diffusion process, and forming a p+ emitter region by activating the p-type impurity region.

2. The method for manufacturing a back electrode-type solar cell according to claim 1, wherein, in said patterning of the thermal diffusion control film so that the back surface of the substrate is selectively exposed, comprising removing the thermal diffusion control film and a predetermined depth of the substrate at a region where the high-concentration back field layer (n+) is to be formed.

3. The method for manufacturing a back electrode-type solar cell according to claim 2, wherein, in said removing of the thermal diffusion control film and a predetermined depth of the substrate at a region where the high-concentration back field layer (n+) is to be formed, comprising irradiating laser onto the thermal diffusion control film at a region where the high-concentration back field layer (n+) is to be formed.

4. The method for manufacturing a back electrode-type solar cell according to claim 2, wherein, in said removing of the thermal diffusion control film and a predetermined depth of the substrate at a region where the high-concentration back field layer (n+) is to be formed, comprising applying an etching paste onto the thermal diffusion control film at a region where the high-concentration back field layer (n+) is to be formed.

5. The method for manufacturing a back electrode-type solar cell according to claim 2, wherein, in said removing of the thermal diffusion control film and a predetermined depth of the substrate at a region where the high-concentration back field layer (n+) is to be formed, comprising removing the thermal diffusion control film and the predetermined depth of the substrate at a region where the high-concentration back field layer (n+) is to be formed by means of reactive ion etching.

6. The method for manufacturing a back electrode-type solar cell according to claim 2, wherein the thickness of the removed substrate corresponds to a depth of the p-type impurity region.

7. A method for manufacturing a back electrode-type solar cell, comprising:
preparing an n-type crystalline silicon substrate;

forming a thermal diffusion control film on a front surface, a back surface and a side surface of the substrate;

forming a p-type impurity region by implanting p-type impurity ions onto the back surface of the substrate;

forming an anti-diffusion film on the back surface of the substrate;

patterning the thermal diffusion control film and the anti-diffusion film so that the back surface of the substrate is selectively exposed; and forming a high-concentration back field layer (n+) at an exposed region of the back surface of the substrate and a low-concentration front field layer (n−) at the front surface of the substrate by performing a thermal diffusion process, and forming a p+ emitter region by activating the p-type impurity region.

8. The method for manufacturing a back electrode-type solar cell according to claim 7, wherein, in said patterning of the thermal diffusion control film and the anti-diffusion film so that the back surface of the substrate is selectively exposed, comprising removing the thermal diffusion control film, the anti-diffusion film and a predetermined depth of the substrate at a region where the high-concentration back field layer (n+) is to be formed.

9. The method for manufacturing a back electrode-type solar cell according to claim 8, wherein, when the thermal diffusion control film, the anti-diffusion film and the predetermined depth of the substrate are removed at a region where the high-concentration back field layer (n+) is to be formed, comprising irradiating laser onto the thermal diffusion control film at a region where the high-concentration back field layer (n+) is to be formed.

10. The method for manufacturing a back electrode-type solar cell according to claim 8, wherein, when the thermal diffusion control film, the anti-diffusion film and the predetermined depth of the substrate are removed at a region where the high-concentration back field layer (n+) is to be formed, comprising removing the thermal diffusion control film and the predetermined depth of the substrate at a region where the high-concentration back field layer (n+) is to be formed by means of reactive ion etching.

11. The method for manufacturing a back electrode-type solar cell according to claim 8, wherein the thickness of the removed substrate corresponds to a depth of the p-type impurity region.

12. The method for manufacturing a back electrode-type solar cell according to claim 1, wherein the thickness of the thermal diffusion control film formed at the front surface of the substrate is relatively smaller than that of the thermal diffusion control films formed at the back surface and the side surface of the substrate.

13. The method for manufacturing a back electrode-type solar cell according to claim 1, wherein the p+ emitter region has a sheet resistance of 10 to 60 Ω/sq.

14. The method for manufacturing a back electrode-type solar cell according to claim 1, wherein the high-concentration back field layer (n+) has a sheet resistance of 10 to 80 Ω/sq.

15. The method for manufacturing a back electrode-type solar cell according to claim 1, wherein the low-concentration front field layer (n−) has a sheet resistance of 50 to 150 Ω/sq.

16. The method for manufacturing a back electrode-type solar cell according to claim 7, wherein the thickness of the thermal diffusion control film formed at the front surface of the substrate is relatively smaller than that of the thermal diffusion control films formed at the back surface and the side surface of the substrate.

17. The method for manufacturing a back electrode-type solar cell according to claim 7, wherein the p+ emitter region has a sheet resistance of 10 to 60 Ω/sq.

18. The method for manufacturing a back electrode-type solar cell according to claim 7, wherein the high-concentration back field layer (n+) has a sheet resistance of 10 to 80 Ω/sq.

19. The method for manufacturing a back electrode-type solar cell according to claim 7, wherein the low-concentration front field layer (n−) has a sheet resistance of 50 to 150 Ω/sq.

* * * * *